US012584696B2

(12) United States Patent
Wong

(10) Patent No.: US 12,584,696 B2
(45) Date of Patent: Mar. 24, 2026

(54) VAPOR CHAMBER SYSTEM

(71) Applicant: National Tsing Hua University, Hsinchu City (TW)

(72) Inventor: Shwin-Chung Wong, Hsinchu City (TW)

(73) Assignee: National Tsing Hua University, Hsinchu City (TW)

( * ) Notice: Subject to any disclaimer, the term of this patent is extended or adjusted under 35 U.S.C. 154(b) by 115 days.

(21) Appl. No.: 18/668,253

(22) Filed: May 20, 2024

(65) Prior Publication Data

US 2024/0302108 A1    Sep. 12, 2024

Related U.S. Application Data

(60) Continuation-in-part of application No. 18/153,365, filed on Jan. 12, 2023, now abandoned, which is a division of application No. 16/782,020, filed on Feb. 4, 2020, now Pat. No. 11,644,250.

(30) Foreign Application Priority Data

Dec. 12, 2019    (TW) ................................. 108145459

(51) Int. Cl.
F28D 15/04        (2006.01)
F28D 15/02        (2006.01)
H05K 7/20         (2006.01)

(52) U.S. Cl.
CPC ....... F28D 15/046 (2013.01); F28D 15/0233 (2013.01); H05K 7/20336 (2013.01); F28D 15/04 (2013.01)

(58) Field of Classification Search
CPC .... F28D 15/046; F28D 15/04; F28D 15/0233; H05K 7/20336
USPC ...................................... 165/104.26
See application file for complete search history.

(56) References Cited

U.S. PATENT DOCUMENTS

| | | | |
|---|---|---|---|
| 6,901,994 B1 * | 6/2005 | Jin-Cherng | ........... F28D 15/046 165/185 |
| 2007/0295486 A1 * | 12/2007 | Su | ......... F28D 15/046 165/104.26 |
| 2013/0025829 A1 * | 1/2013 | Huang | ................ F28D 15/0233 165/104.26 |
| 2019/0271511 A1 * | 9/2019 | Kishimoto | .............. F28D 15/04 |
| 2025/0107043 A1 * | 3/2025 | Sun | ......................... H01L 23/427 |

* cited by examiner

*Primary Examiner* — Joel M Attey
(74) *Attorney, Agent, or Firm* — JCIPRNET

(57)        ABSTRACT

A vapor chamber system, includes a heat source and a vapor chamber device. The vapor chamber device includes a first casing, a second casing, a second capillary structure and a third capillary structure. The first casing includes a first plate, and a first capillary structure. The second casing is stacked on the first casing. The second capillary structure is disposed between the first capillary structure and the supporting posts of the second casing. The third capillary structure is disposed at a zone of the inner surface of the first plate, the zone is within a projection of the heat source projected onto the inner surface, and an area of the zone is smaller than an area of the projection of the heat source.

7 Claims, 17 Drawing Sheets

VAPOR CHAMBER SYSTEM

CROSS-REFERENCE TO RELATED APPLICATION

This application is a continuation-in-part application of and claims the priority benefit of U.S. application Ser. No. 18/153,365, filed on Jan. 12, 2023. The prior U.S. application Ser. No. 18/153,365 is a divisional application of and claims the priority benefit of U.S. application Ser. No. 16/782,020, filed on Feb. 4, 2020, which claims the priority benefit of Taiwan application serial no. 108145459, filed on Dec. 12, 2019. The entirety of each of the above-mentioned patent applications is hereby incorporated by reference herein and made a part of this specification.

BACKGROUND

Technical Field

The disclosure relates to a vapor chamber system, and in particular, to a high-efficacy vapor chamber system.

Description of Related Art

A vapor chamber is a common heat sink. The vapor chamber mainly includes a flat sealed casing, a capillary tissue formed in the flat sealed casing, and working fluid filling the flat sealed casing. The flat sealed casing contacts a heat source, e.g., a central processing unit (CPU), and dissipates heat for the heat source through a vapor-liquid phase change of the working fluid in the vapor chamber. How to improve heat dissipation capacity of the vapor chamber is to be researched in the field.

SUMMARY

The disclosure provides a vapor chamber system having a favorable heat dissipation effect.

A vapor chamber system, includes a heat source and a vapor chamber device. The vapor chamber device includes a first casing, a second casing, a second capillary structure and a third capillary structure. The first casing includes a first plate, a first capillary structure at an inner surface of the first plate, and a first lateral wall protruding from the inner surface and surrounding the first capillary structure, the heat source is in contact with an outer surface of the first plate. The second casing is stacked on the first casing and includes a second plate, a plurality of supporting posts protruding from the second plate, and a second lateral wall protruding from the second plate and surrounding the supporting posts, the supporting posts face towards the first capillary structure, and the first lateral wall is connected to the second lateral wall. The second capillary structure is disposed between the first capillary structure and the supporting posts of the second casing, the supporting posts abut against the second capillary structure. The third capillary structure is disposed at a zone of the inner surface of the first plate, the third capillary structure comprises metal powders or non-woven metal wool, the zone is within a projection of the heat source projected onto the inner surface, and an area of the zone is smaller than an area of the projection of the heat source.

In an embodiment of the disclosure, the first capillary structure includes a plurality of trenches formed between a plurality of protruding bars, the third capillary structure is only filled in a part of the trenches corresponding to the zone.

In an embodiment of the disclosure, the first capillary structure is not disposed in the zone, the first casing includes a plurality of supporters disposed in the zone, and the third capillary structure surrounds the supporters.

In an embodiment of the disclosure, the third capillary structure is only disposed between the inner surface of the first plate and the second capillary structure, the third capillary structure is not filled into the second capillary structure.

In an embodiment of the disclosure, a part of the first capillary structure is disposed in the zone where the third capillary structure is located, the first casing comprises a plurality of supporters disposed in the zone, the third capillary structure surrounds the supporters, and the supporters contacts the part of the first capillary structure in the zone.

In an embodiment of the disclosure, a ratio of the area of the zone to the area of the projection of the heat source is between 0.001~0.5.

In an embodiment of the disclosure, a ratio of the area of the zone to the area of the projection of the heat source is between 0.05~0.2.

Based on the above, for the vapor chamber system of the disclosure, the third capillary structure is disposed at the zone of the inner surface of the first plate, the zone is within the projection of the heat source projected onto the inner surface, and the area of the zone is smaller than the area of the projection of the heat source, so as to improve heat dissipation efficiency.

BRIEF DESCRIPTION OF THE DRA WINGS

DESCRIPTION OF THE EMBODIMENTS

Figure 1A:
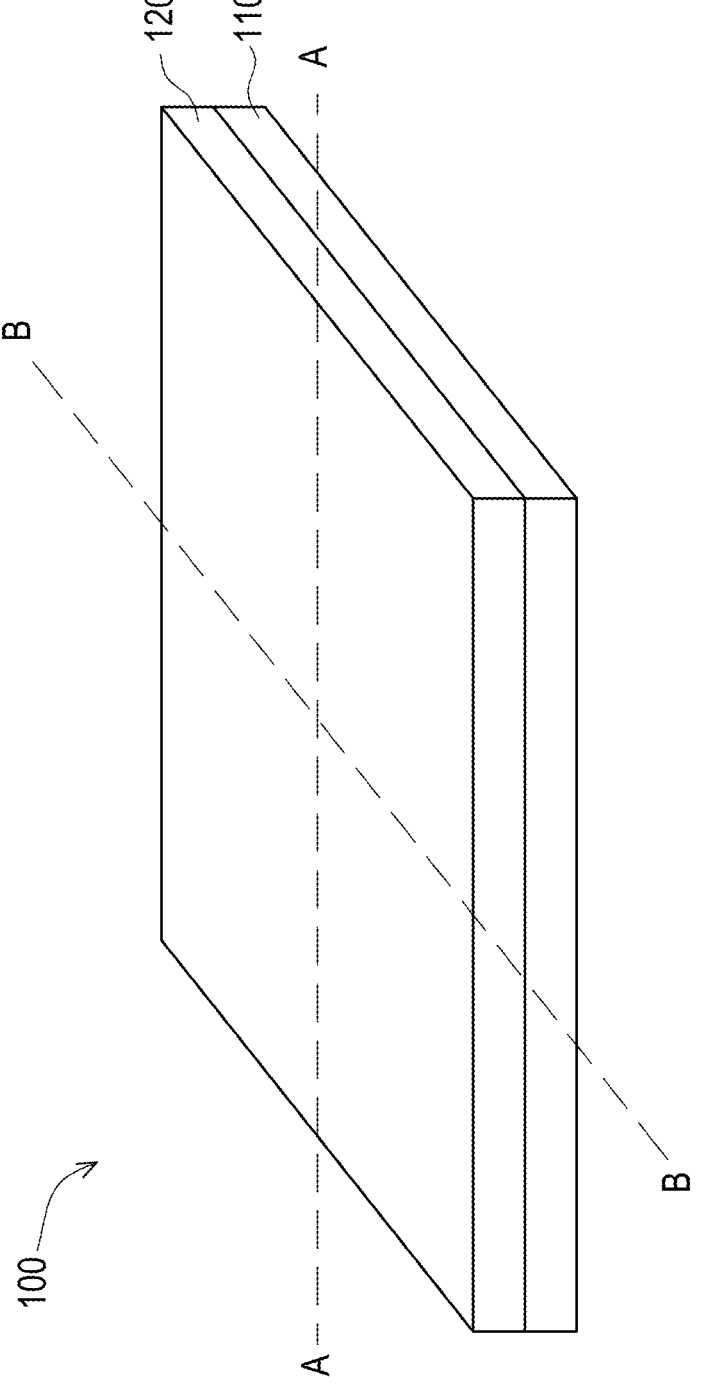
FIG. 1A is a schematic diagram of an appearance of a vapor chamber device according to an embodiment of the disclosure.
Figure 1B:
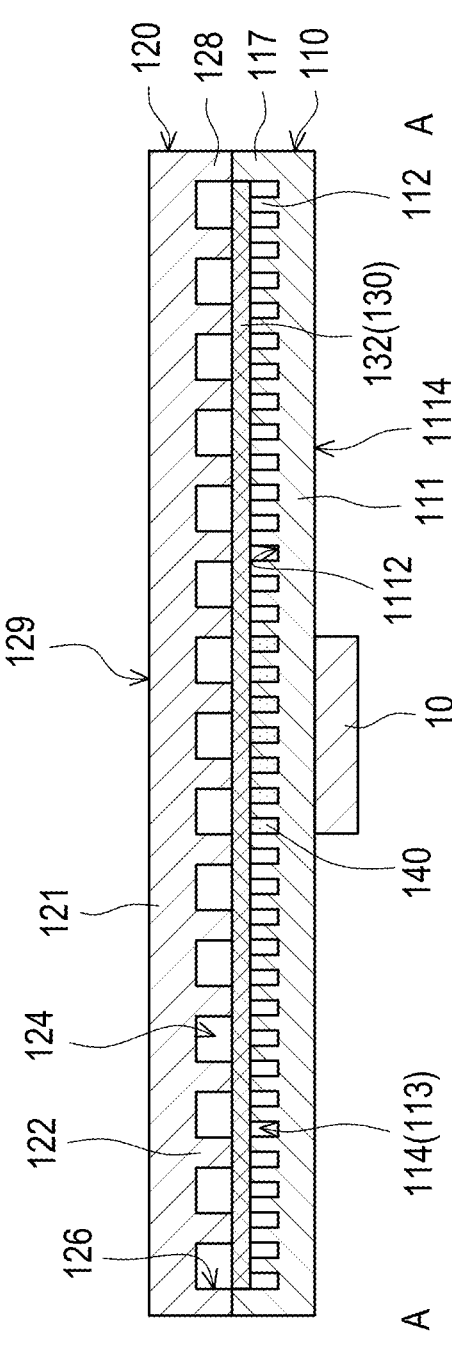
FIG. 1B is a schematic cross-sectional view of the vapor chamber device taken along line A-A of FIG. 1A.
Figure 1C:
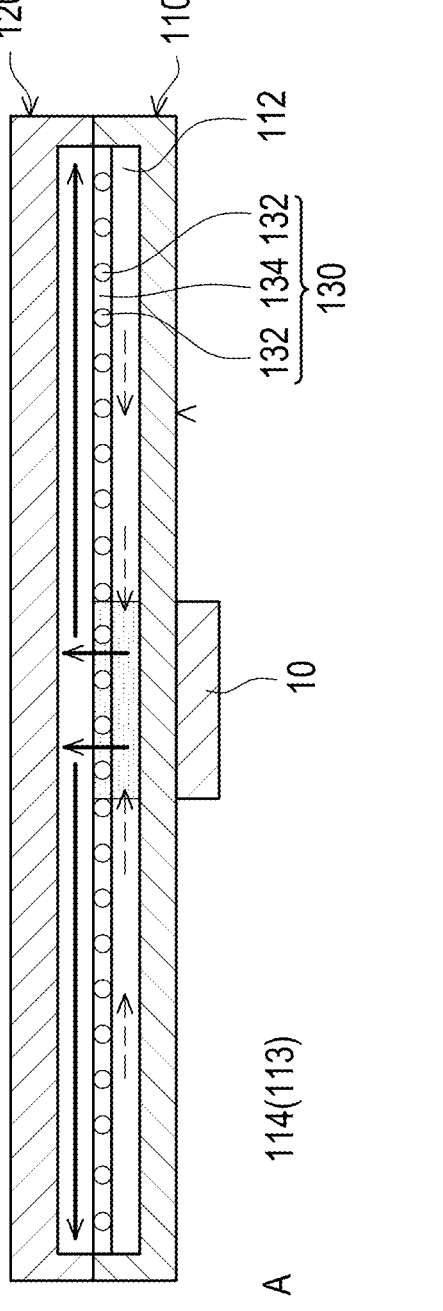
FIG. 1C is a schematic cross-sectional view of the vapor chamber device taken along line B-B of FIG. 1A.

FIG. 1A is a schematic diagram of an appearance of a vapor chamber device according to an embodiment of the disclosure. However, the shape of the appearance is not limited to a square plate shape and may be any shape. FIG. 1B is a schematic cross-sectional view of the vapor chamber device taken along line A-A of FIG. 1A. FIG. 1C is a schematic cross-sectional view of the vapor chamber device taken along line B-B of FIG. 1A.

With reference to FIG. 1A to FIG. 1C, a vapor chamber device 100 of the present embodiment is adapted to be thermally coupled to a heat source 10 (FIG. 1B). The heat source 10 is, for example, a central processing unit of a main board, but the heat source 10 may also be other chips, and the type and quantity of heat sources 10 are not limited thereto. The vapor chamber device 100 includes a first casing 110 and a second casing 120. As shown in FIG. 1B, the first casing 110 includes a first plate 111, a first capillary structure 113 at an inner surface 1112 of the first plate 111, and a first lateral wall 117 protruding from the inner surface 1112 and surrounding the first capillary structure 113. The heat source 10 is adapted to be in contact with an outer surface 1114 of the first casing of the first plate 111, and heat energy generated by the heat source 10 is transferred to the vapor chamber device 100.

As shown in FIG. 1B and FIG. 1C, the first capillary structure 113 includes a plurality of trenches 114 formed between a plurality of protruding bars 112. More specifically, the protruding bars 112 protrude from the inner surface 1112 of the first plate, so that trenches 114 are defined between two adjacent protruding bars 112. The design of the first capillary structure 113 using the trenches 114 may provide a smaller flow resistance. In the present embodiment, a width of the trench 114 is, for example, between 50 µm and 200 µm, and a depth of the trench 114 is, for example, between 50 µm and 200 µm, but the width and the depth of the trench 114 are not limited thereto. However, capillary force of a simple open trench is insufficient, and the simple open trench is not suitable for a non-horizontal vapor chamber device working against gravity. However, if a second capillary structure 130 is covered with a layer of mesh, it may not only maintain the advantage of low flow resistance of the trench, but also significantly improve capillary force, so that the vapor chamber device is adapted to be placed against gravity. If non-woven metal wool or metal powders with stronger capillary force are further added to the capillary structure near the heat source 10, the capillary force there may further be enhanced, and the anti-drying capability may be improved.

Therefore, as shown in FIG. 1B, the vapor chamber device 100 further includes a second capillary structure 130 and a third capillary structure 140 disposed near the corresponding heat source 10. The second capillary structure 130 is disposed between the first capillary structure 113 and supporting posts 122, to cover the first capillary structure 113 and strengthen the capillary and channel functions of the first capillary structure 113. The third capillary structure 140 is only disposed in the capillary structure near a position corresponding to the heat source 10, and does not block a path through which liquid passes when flowing back.

In addition, in the present embodiment, the first plate 111 and the protruding bars 112 are integrally formed, and such a design may have a relatively simple structure. Since there is no thermal contact resistance between the first plate 111 and the protruding bars 112 (that is, between the first plate 111 and the trenches 114), the heat transfer effect is better.

The second casing 120 is stacked on the first casing 110 and includes a second plate 121, a plurality of supporting posts 122 protruding from the second plate 121, and a second lateral wall 128 protruding from the second plate 121 and surrounding the supporting posts 122. In the present embodiment, the supporting posts 122 are flush with the second lateral wall 128, but a relationship between the supporting posts 122 and the second lateral wall 128 is not limited thereto.

Figure 1D:
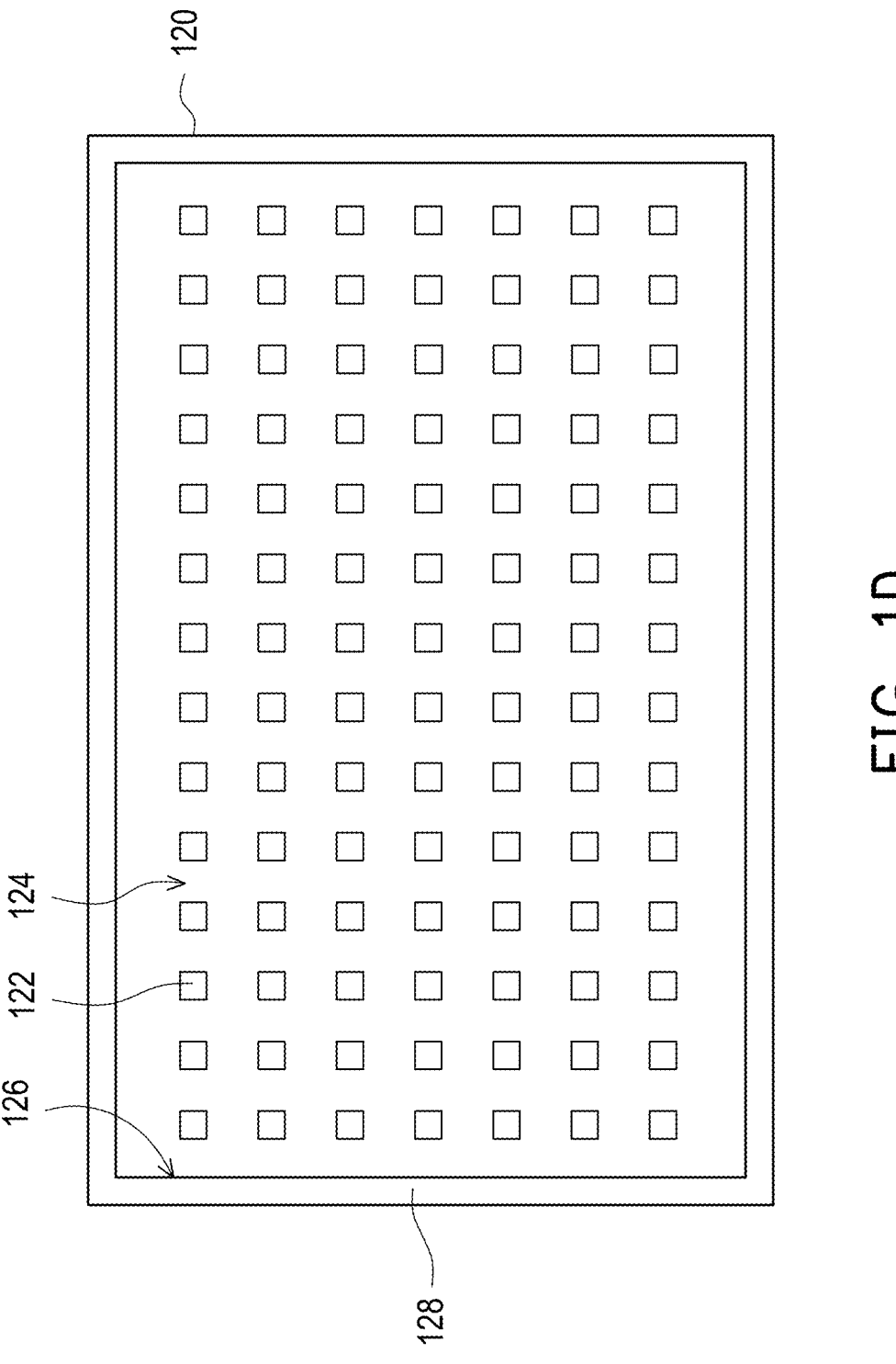
FIG. 1D is a schematic diagram of an inner surface of a second casing of the vapor chamber device of FIG. 1A.

FIG. 1D is a schematic diagram of an inner surface of a second casing of the vapor chamber device of FIG. 1A. With reference to FIG. 1D, in the present embodiment, shapes of the supporting posts 122 are uniformly and evenly distributed on the inner surface of the second plate 121, and a plurality of vapor channels 124 is formed between the supporting posts 122. The supporting posts 122 are, for example, square posts, but in other embodiments, the supporting posts 122 may also be rectangular posts, cylinders, elliptical posts, polygonal posts, tapered posts, irregular posts, or/and a combination thereof. Shapes and forms of distribution of the supporting posts 122 are not limited thereto. The supporting posts 122 are integrally formed with the second plate 121, but may alternatively be joined through other manners such as welding and depositing.

Figure 1E:
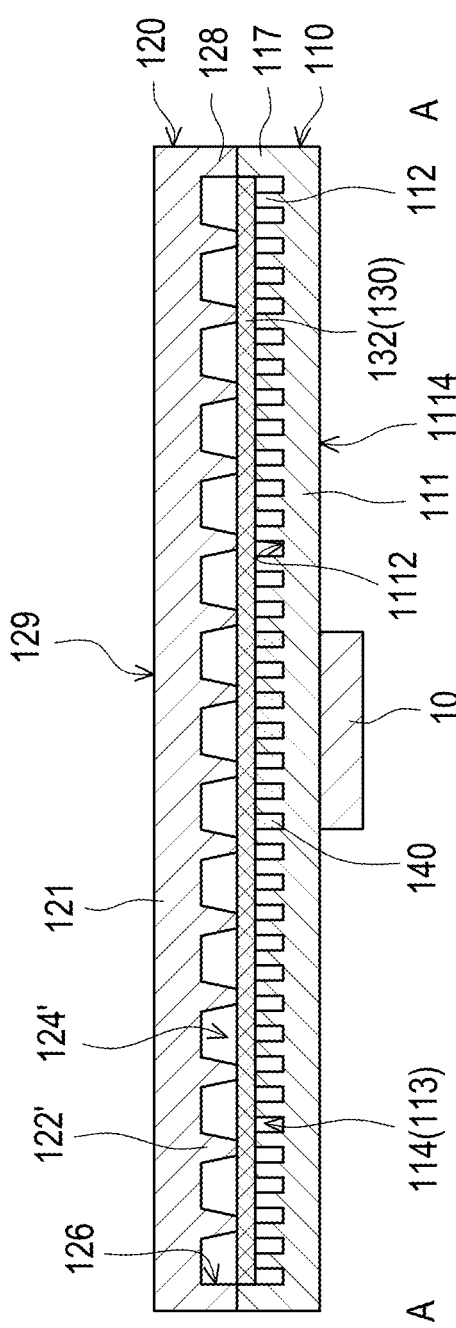
FIG. 1E is a schematic cross-sectional view of a vapor chamber device according to another embodiment of the disclosure.

FIG. 1E is a schematic cross-sectional view of a vapor chamber device according to another embodiment of the disclosure. Cross-sectional shapes of supporting posts 122' of a vapor chamber device 100' are inverted trapezoids, and therefore a cross-sectional shape of a constructed vapor channel 124' is trapezoidal. In other embodiments, the supporting posts 122' include a plurality of rectangular posts, a plurality of conical posts, a plurality of trapezoidal posts, a plurality of cylinders, or a plurality of irregular posts. Therefore, the cross-sectional shapes of the supporting posts 122' may be triangles, arcs, or other shapes. Similarly, the cross-sectional shape of the vapor channel 124' may be a triangle, an arc, or other shapes.

Returning to FIG. 1B, in the present embodiment, the supporting posts 122 face the first capillary structure 113. In addition, in the present embodiment, the first casing 110 and the second casing 120 are, for example, two metal casings, and the first lateral wall 117 is engaged with the second lateral wall 128 to provide favorable structural strength. A manner in which the first lateral wall 117 and the second lateral wall 128 is, for example, diffusion bonding or brazing, which should however not be construed as a limitation in the disclosure.

In the present embodiment, the first capillary structure 113 is slightly lower than the first lateral wall 117, and when the second capillary structure 130 is approximately flush with the first lateral wall 117 when being disposed on the first capillary structure 113, so that when the first lateral wall 117 is engaged with the second lateral wall 128, the supporting posts 122 may abut against the second capillary structure 130. Definitely, in other embodiments, the foregoing height relationship is not limited thereto.

It should be noted that, in the present embodiment, an appropriate amount of working fluid g such as water fills inner space surrounded by the first casing 110 and the second casing 120, but the type of the working fluid g is not limited thereto. For example, the working fluid g flows in the trench 114 of the first capillary structure 113 of the first casing 110 in a form of liquid. The working fluid g absorbs heat in an area close to the heat source 10 and evaporates into vapor.

Therefore, in the present embodiment, the supporting posts 122 abut against the second capillary structure 130, and may support the second plate 121, which may effectively prevent the first casing 110, the second casing 120, and the vapor channel 124 from being collapsed during evacuating. In addition, when the working fluid g is condensed into liquid from vapor, the working fluid g may also flow down along a lateral wall of the supporting post 122. In other words, the supporting posts 122 may also serve as a structure for guiding the working fluid g (liquid) to flow down.

In the present embodiment, the second capillary structure 130 is a mesh structure woven by a plurality of wires 132, such as a copper mesh. Definitely, in other embodiments, the second capillary structure 130 may also be a non-woven mesh or a porous metal foam capillary structure, and the form of the second capillary structure 130 is not limited thereto.

It is worth mentioning that in FIG. 1B, since the second capillary structure 130 is disposed on the trenches 114 of the first capillary structure 113, tops of the trenches 114 of the first capillary structure 113 are covered by the second capillary structure 130. However, a similar capillary structure is formed in a direction (a direction of emitting or injecting into the drawing surface) in which the trenches 114 extend, and the structure may enable the working fluid g in the trenches 114 to resist gravity and allow the vapor chamber device 100 to complete thermal cycle well under a non-horizontal condition.

In addition, in the present embodiment, the third capillary structure 140 is disposed in an area that is at the inner surface 1112 of the first plate 111 and that corresponds to the heat source 10. In particular, in the present embodiment, since the trenches 114 of the first capillary structure 113 are evenly distributed on the first plate 111, some (especially a central trench) of the trenches 114 correspond to the area that is on the first plate 111 and that corresponds to the heat source 10. Therefore, in the present embodiment, an area that is in the trenches 114 and corresponds to the heat source 10 is filled with the third capillary structure 140.

As shown in FIG. 1C, the second capillary structure 130 includes a plurality of holes 134. It should be noted that, in a cross section of FIG. 1B, wires 132 of the second capillary structure 130 are just cut, and the holes 134 cannot be seen. In a cross section of FIG. 1C, a relationship between the wires 132 of the second capillary structure 130 and the holes 134 may be observed. In addition, the cross section of FIG. 1C is just cut along one of the trenches 114 of the first capillary structure 113, and the protruding bars 112 cannot be seen in this section. The supporting posts 122 of the second casing 120 are not cut in FIG. 1C, and only the vapor channel 124 is shown.

The holes 134 corresponding to the heat source 10 are filled with the third capillary structure 140. In the present embodiment, a sintered capillary structure is taken as an example of the third capillary structure 140. For example, metal powders are sintered in a local area of the trenches 114 and the holes 134. Definitely, in other embodiments, the form of the third capillary structure 140 is not limited thereto. In addition, in an embodiment that is not illustrated, the second capillary structure 130 may also be a metal foam layer with a large number of holes inside, and the holes of the metal foam layer and the trenches 114 of the first capillary structure 113 are filled with the third capillary structure 140 (metal powders).

As shown in FIG. 1C, the outer surface 1114 (marked in FIG. 1B) of the first casing 110 of the vapor chamber device 100 is in contact with the heat source 10, heat generated by the heat source 10 is transferred to the first casing 110. An area that is of the vapor chamber device 100 and that corresponds to the heat source 10 is referred to as an evaporation area. In the evaporation area, the liquid in the trenches 114 absorbs heat and vaporizes into vapor. The working fluid g (vapor) flows upward to the vapor channel 124 of the second casing 120 and diffuse into an internal vapor cavity of the second casing 120, further condenses into a liquid in the condensing area (for example, the outer surface 129 of the second casing of the vapor chamber plate, or a selected area of the outer surface 1114 of the first casing that is not in contact with the heat source 10) of the vapor chamber plate, and the heat is discharged from the vapor chamber device 100. The condensed working fluid g (liquid) flows down to the trench 114 of the first casing 110 and flows through the trench 114 to the third capillary structure 140 to complete a cycle.

It is worth mentioning that, in the present embodiment, the trenches 114 of the first capillary structure 113 and the holes 134 of the second capillary structure 130 in the evaporation area are filled with the third capillary structure 140. Since the third capillary structure 140 provides strong capillary force, the working fluid g may be easily sucked into the evaporation area, to avoid a case that the vaporized liquid in the evaporation area cannot be supplemented in time, thereby providing good anti-drying capability. In addition, the trenches 114 of the first capillary structure 113 and the holes 134 of the second capillary structure 130 are not provided with a third capillary structure 140 outside an area corresponding to the heat source 10, so that a low flow resistance may be maintained.

In this way, the foregoing design of the vapor chamber device 100 may greatly increase the maximum heat dissipation amount without increasing the thickness (the thickness of the first capillary structure 113 and the second capillary structure 130 may be maintained), and may be applied to a thin device. Through testing, in comparison with the vapor chamber without the third capillary structure 140, the maximum heat dissipation amount of the vapor chamber device 100 of the present embodiment may be increased by at least 50%, so that the vapor chamber device has improved performance.

The working fluid evaporates in the capillary structure close to the heat source, and the formed vapor passes through the cross-shaped vapor flow channel formed between the plurality of supporting posts of the second plate, diffuses to the vapor cavity inside the entire vapor chamber, and further condenses into a liquid in the condensing area of the vapor chamber, and the heat is discharged from the vapor chamber device. The condensed liquid passes through the capillary structure below, flows back to the area near the heat source, and evaporates, to complete a thermal cycle. Since the third capillary structure corresponding to the heat source area has stronger capillary force, and the trenches that are in the first capillary structure and that are covered by the second capillary structure have both lower flow resistance and stronger capillary force, the three capillary structures are properly matched, so that the working fluid may flow back to the evaporation area near the heat source more quickly, and the evaporation area of the vapor chamber device is less easier to dry out and has more favorable heat dissipation efficiency.

A vapor chamber device in another pattern or a second casing thereof is described below. Same or similar elements as the previous embodiment are denoted by same or similar symbols. The descriptions thereof are omitted herein, and only main differences are described.

Figure 2A:
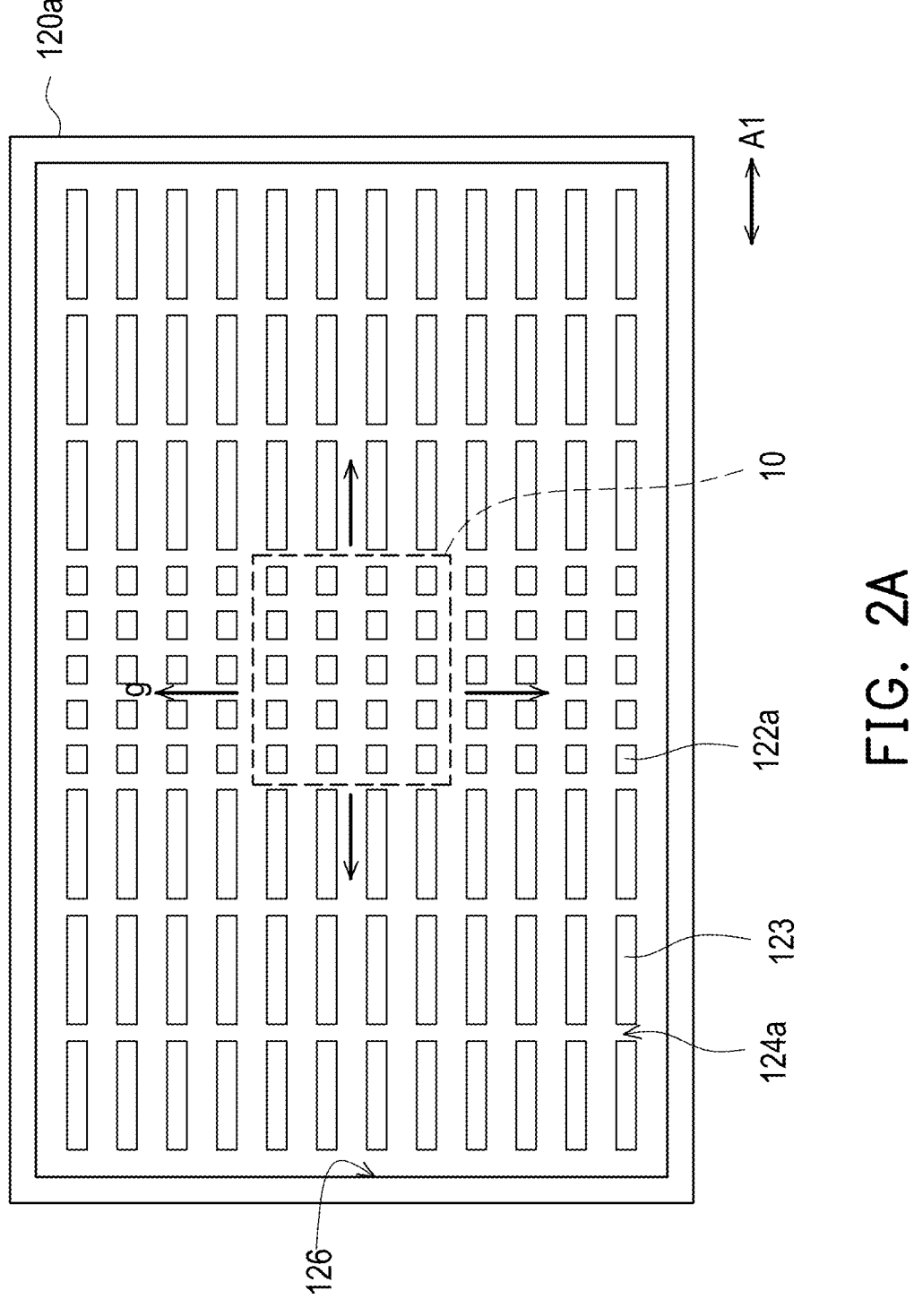
FIG. 2A and FIG. 2B are schematic diagrams of a second casing of a plurality of vapor chamber devices according to other embodiments of the disclosure.
Figure 2B:
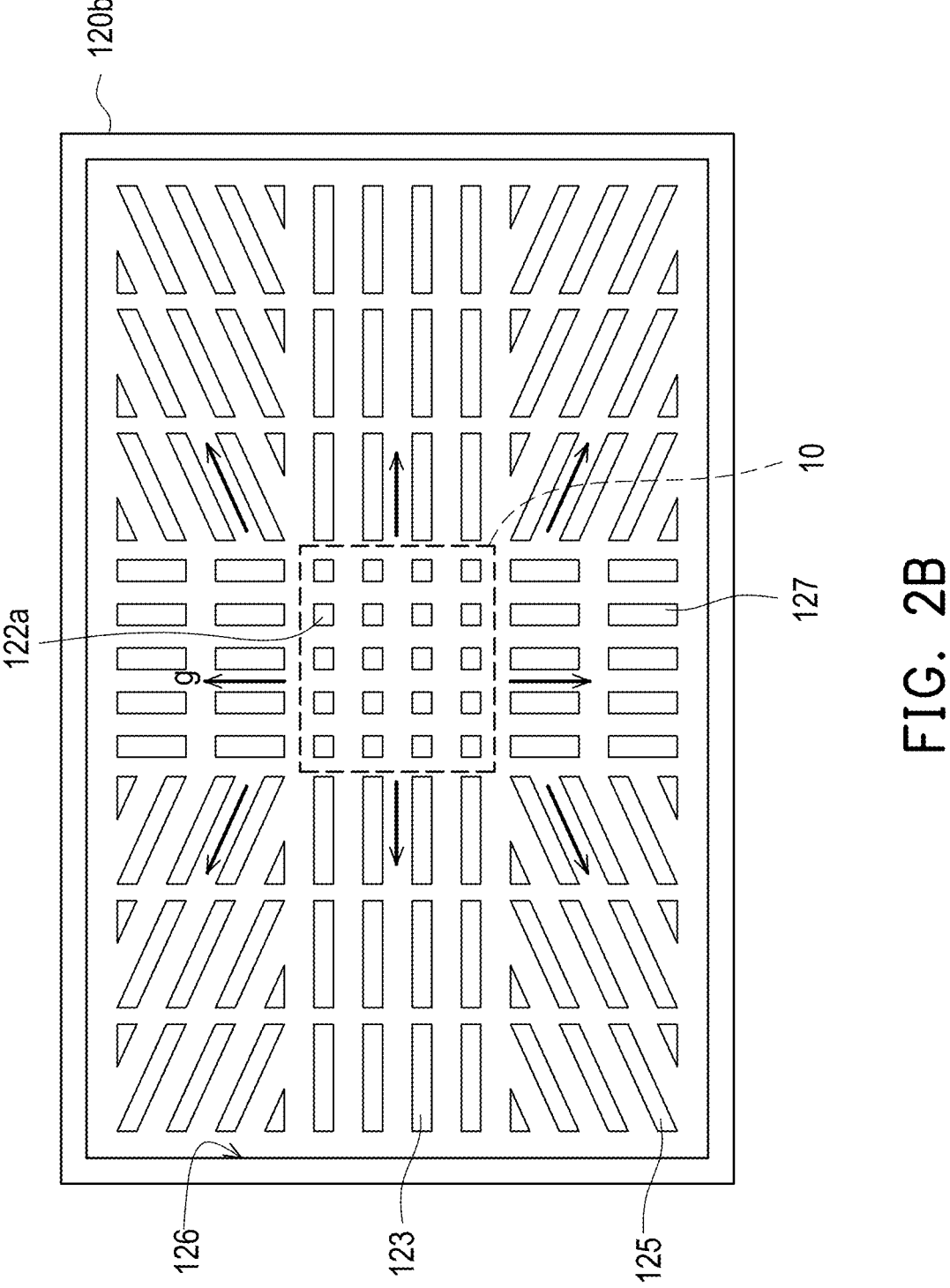

FIG. 2A and FIG. 2B are schematic diagrams of a second casing of a plurality of vapor chamber devices according to other embodiments of the disclosure. With reference to FIG. 2A first, a main difference between the second casing 120a of FIG. 2A and the second casing 120 of FIG. 1D is that, in the present embodiment, these supporting posts include a plurality of first supporting posts 122a and a plurality of second supporting posts 123, and a shape of the first supporting post 122a is different from a shape of the second supporting post 123. The first supporting posts 122a are disposed corresponding to the heat source 10, and the second supporting posts 123 are located beside the first supporting posts 122a and extend along an axial direction A1.

In the present embodiment, the second casing 120a is provided with densely populated first supporting posts 122a corresponding to the heat source 10, so as to provide good structural strength. The second supporting posts 123 are disposed on both sides of the first supporting posts 122a and extend along the axial direction A1 to guide a flow direction of the working fluid g (vapor).

With reference to FIG. 2B, a main difference between the second casing 120b of FIG. 2B and the second casing 120a of FIG. 2A is that, in the present embodiment, one portion (the first supporting posts 122a) of these supporting posts is disposed corresponding to the heat source 10, and the other portion of the supporting posts (the second supporting posts 123, 125, and 127) is radially arranged around the first supporting posts 122a as a center. Such a design may also well guide the flow direction of the working fluid g (vapor).

Figure 2C:
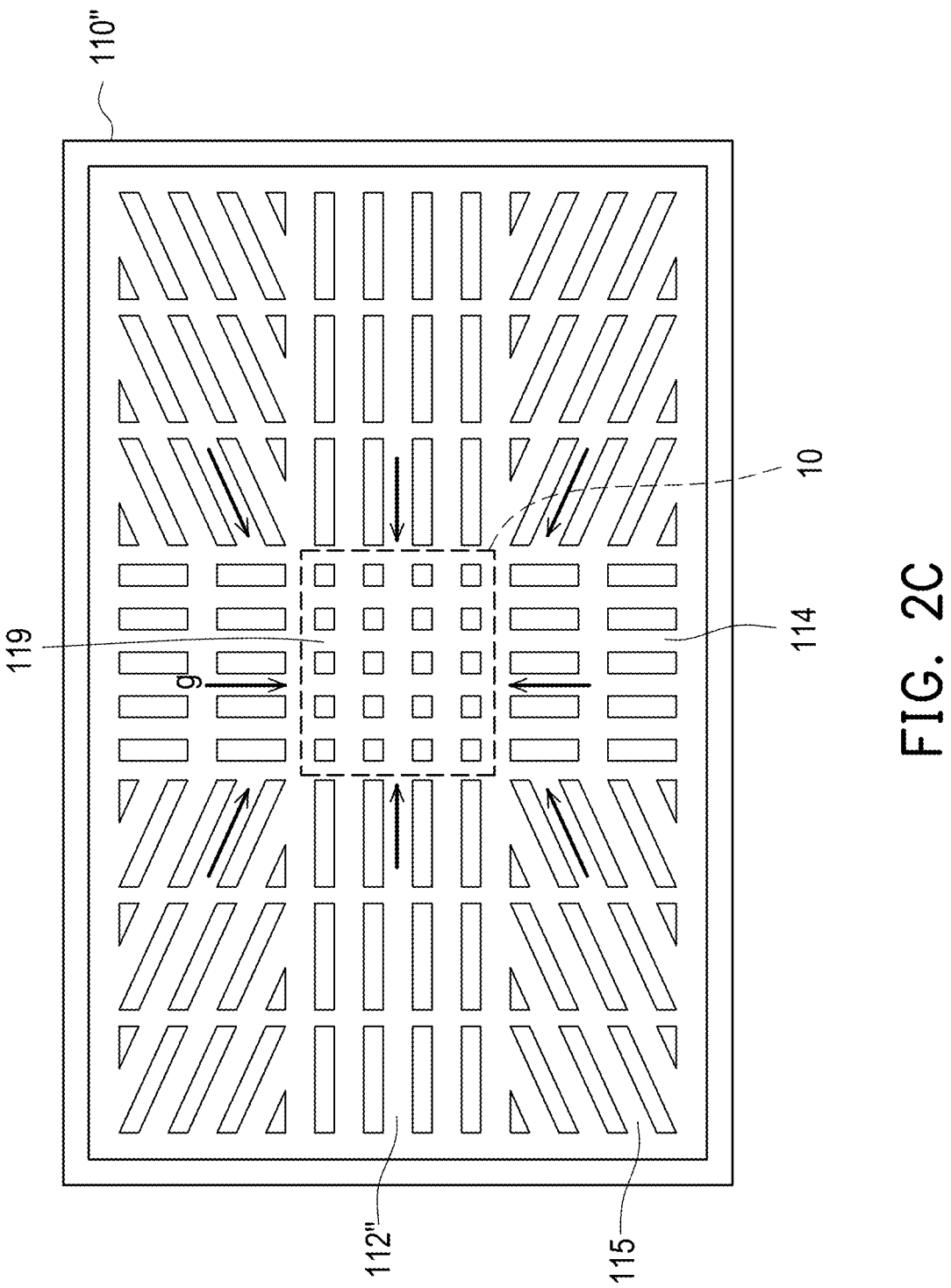
FIG. 2C is a schematic diagram of an inner surface of a first casing of a vapor chamber device according to other embodiments of the disclosure.

FIG. 2C is a schematic diagram of an inner surface of a first casing of a vapor chamber device according to other embodiments of the disclosure. With reference to FIG. 2C, in the present embodiment, the first casing 110" has trenches 114, 112", 115, and 119 with a plurality of different directions, and the trenches are radial to reduce the flow resistance and allow the condensed liquid to flow back quickly. The arrangement pattern of the trenches on the inner surface of the first casing is not limited to a radial pattern, and any arrangement pattern sufficient to guide the working fluid g (liquid) may be applicable.

Figure 3:
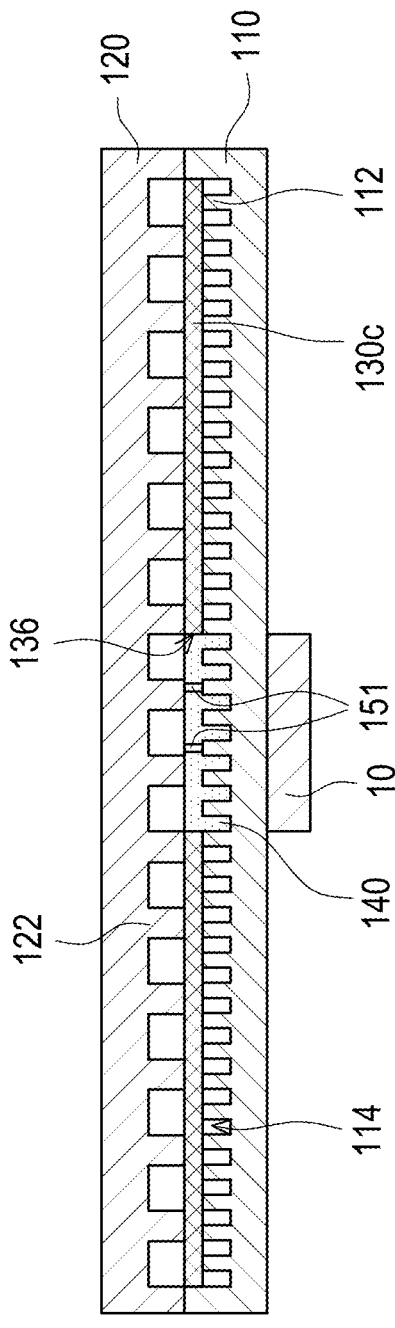
FIG. 3 is a schematic diagram of a vapor chamber device according to another embodiment of the disclosure.

FIG. 3 is a schematic diagram of a vapor chamber device according to another embodiment of the disclosure. With reference to FIG. 3, a main difference between a vapor chamber device 100c of FIG. 3 and the vapor chamber device 100 of FIG. 1B is that, in the present embodiment, a second capillary structure 130c has an opening 136 corresponding to a heat source 10, and the entire opening 136 is filled with a third capillary structure 140. In other words, in the present embodiment, the capillary structure that is in the evaporation area and that corresponds to the heat source 10 is mainly composed of the trenches 114 and the third capillary structure 140. In the embodiment, supporters 151 are disposed between the protruding bars 112 and the second supporting post 122, and the supporters 151 are located within the third capillary structure 140. The second supporting post 122 are supported by the supporters 151 so as to improve the anti-pressure strength of the vapor chamber device 100c.

Figure 4:
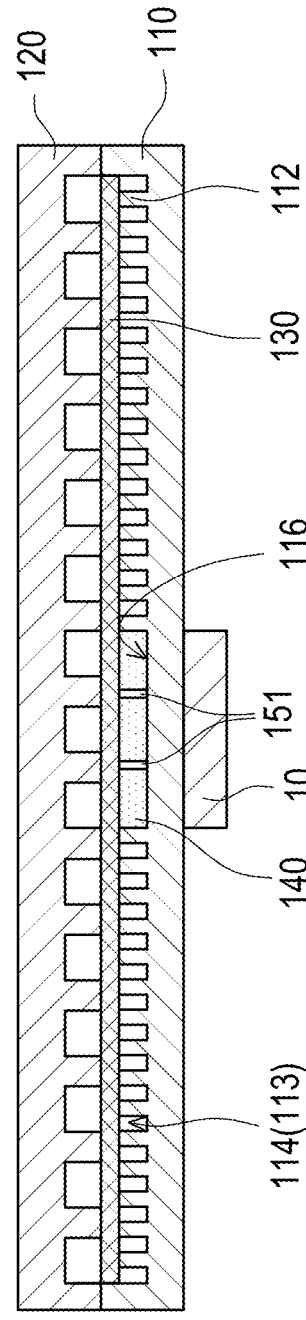
FIG. 4 is a schematic diagram of a vapor chamber device according to another embodiment of the disclosure.

FIG. 4 is a schematic diagram of a vapor chamber device according to another embodiment of the disclosure. With reference to FIG. 4, a main difference between a vapor chamber device 100d of FIG. 4 and the vapor chamber device 100 of FIG. 1B is that, in the present embodiment, a first casing 110 has a cavity 116 corresponding to a heat source 10, and a first capillary structure 113 is located outside the cavity 116. The cavity 116 corresponding to the heat source 10 is filled with the third capillary structure 140. In other words, in the present embodiment, the capillary structure that is in the evaporation area and that corresponds to the heat source 10 is mainly composed of the second capillary structure 130 and the third capillary structure 140. In the embodiment, the supporters 151 are located within the third capillary structure 140. The second capillary structure 130 are supported by the supporters 151 so as to improve the anti-pressure strength of the vapor chamber device 100d.

Figure 5:
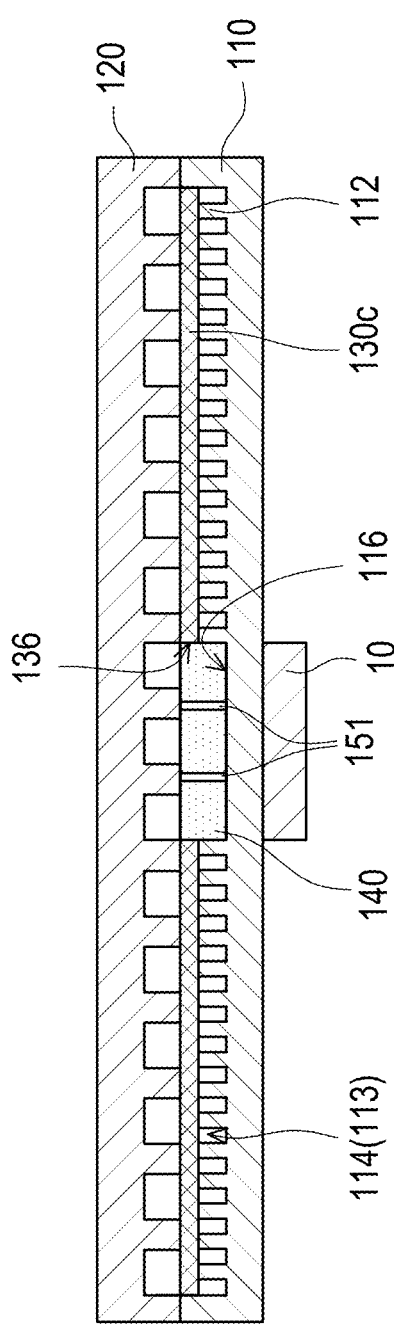
FIG. 5 is a schematic diagram of a vapor chamber device according to another embodiment of the disclosure.

FIG. 5 is a schematic diagram of a vapor chamber device according to another embodiment of the disclosure. With reference to FIG. 5, a main difference between the vapor chamber device 100e of FIG. 5 and the vapor chamber device 100d of FIG. 4 is that, in the present embodiment, a second capillary structure 130c has an opening 136 corresponding to a heat source 10, and the entire opening 136 is filled with a third capillary structure 140. In other words, in the present embodiment, the capillary structure that is in the evaporation area and that corresponds to the heat source 10 is mainly composed of the third capillary structure 140. In the embodiment, the supporters 151 are located within the third capillary structure 140. The second supporting post 122 are supported by the supporters 151 so as to improve the anti-pressure strength of the vapor chamber device 100e.

A contact surface of the first capillary structure and the second capillary structure may be sintered or bonded by thermocompression, and the third capillary structure between the first capillary structure and the second capillary structure may also be sintered to enhance the structural strength and heat-conducting performance.

Figure 6A:
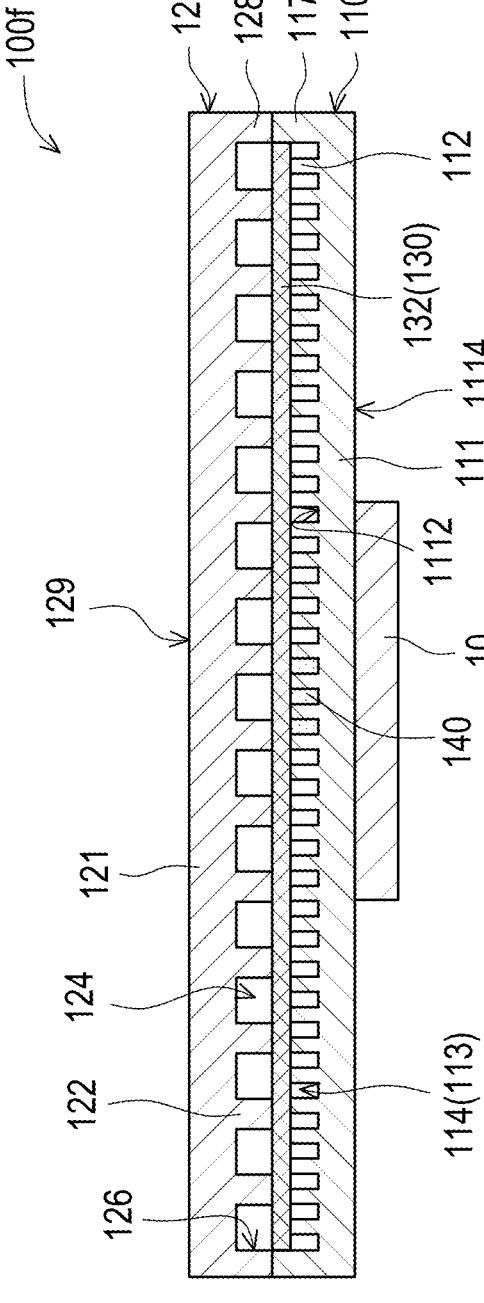
FIG. 6A is a schematic cross-sectional view of a vapor chamber system according to an embodiment of the disclosure.
Figure 6B:
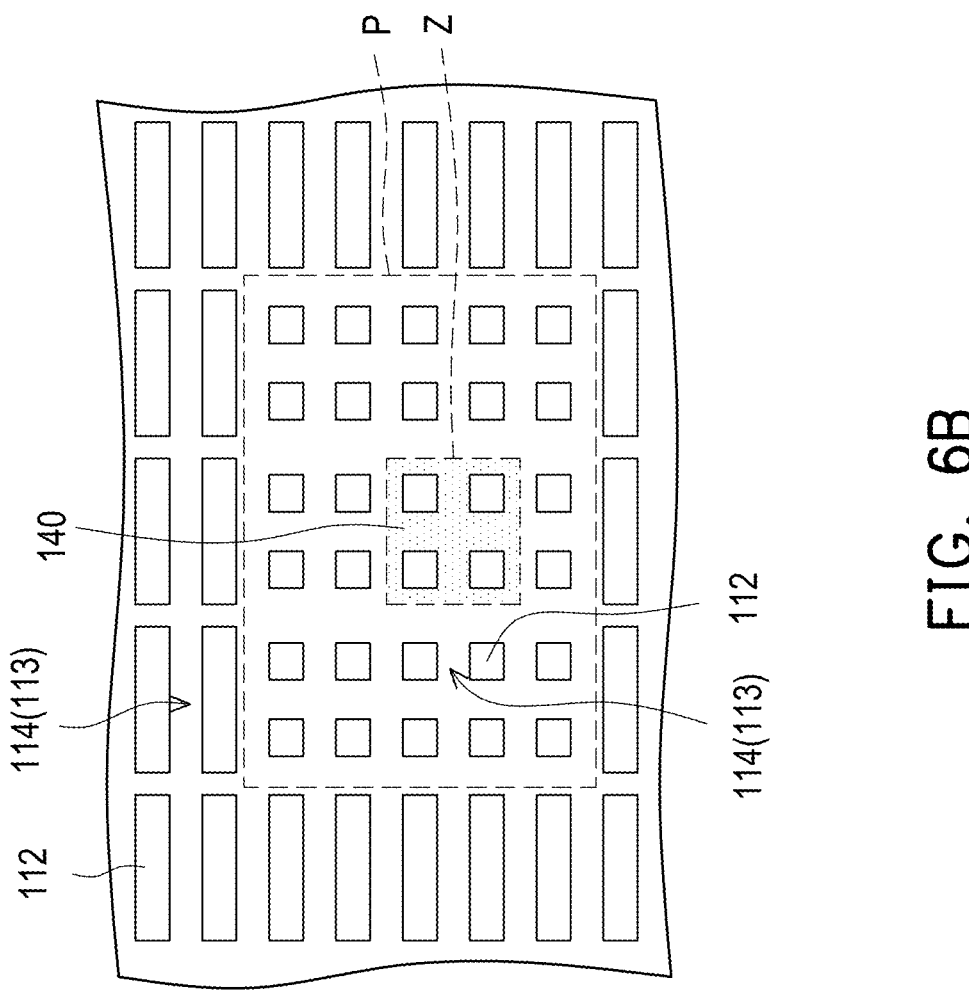
FIG. 6B is a partial schematic diagram of an inner surface of a first casing of the vapor chamber device of FIG. 6A.

FIG. 6A is a schematic cross-sectional view of a vapor chamber system according to an embodiment of the disclosure. FIG. 6B is a partial schematic diagram of an inner surface of a first casing of the vapor chamber device of FIG. 6A.

Referring to FIG. 6A and FIG. 6B, in the embodiment, a vapor chamber system 20 includes a heat source 10 and a vapor chamber device 100f. The vapor chamber device 100f includes a first casing 110, a second casing 120, a second capillary structure 130 and a third capillary structure 140. The first casing 110 includes a first plate 111, a first capillary structure 113 at an inner surface 1112 of the first plate 111, and a first lateral wall 117 protruding from the inner surface 1112 and surrounding the first capillary structure 113, the heat source 10 is in contact with an outer surface 1114 of the first plate 111.

In the embodiment, the first capillary structure 113 includes trenches 114 formed between protruding bars 112, and the trenches 114 and the protruding bars 112 are distributed at the inner surface 1112 of the first plate 111. As shown in FIG. 6B, the type of the protruding bars 112 in the projection P of the heat source 10 may be different from the type of the protruding bars 112 out of the projection P of the heat source 10. For example, the size of the protruding bars 112 in the projection P of the heat source 10 may be smaller than the size of the protruding bars 112 out of the projection P of the heat source 10. The shape of the protruding bars 112 in the projection P of the heat source 10 may be similar to a cube, and the shape of the protruding bars 112 out of the projection P of the heat source 10 may be cuboid.

However, the shape and the size of the protruding bars 112 in the projection P of the heat source 10 and the shape and the size of the protruding bars 112 out of the projection P of the heat source 10 are not limited thereto. In addition, in other embodiment, the type of the protruding bars 112 in the projection P of the heat source 10 may be the same as the type of the protruding bars 112 out of the projection P of the heat source 10.

The second casing 120 is stacked on the first casing 110 and includes a second plate 121, supporting posts 122 protruding from the second plate 121, and a second lateral wall 128 protruding from the second plate 121 and surrounding the supporting posts 122, the supporting posts 122 face towards the first capillary structure 113, and the first lateral wall 117 is connected to the second lateral wall 128.

The second capillary structure 130 is disposed between the first capillary structure 113 and the supporting posts 122 of the second casing 120, the supporting posts 122 abut against the second capillary structure 130. In the present embodiment, the second capillary structure 130 is a mesh structure woven by a plurality of wires 132, such as a copper mesh. Definitely, in other embodiments, the second capillary structure 130 may also be a non-woven mesh or a porous metal foam capillary structure, and the form of the second capillary structure 130 is not limited thereto.

As shown in FIG. 6B, the third capillary structure 140 is disposed at a zone Z of the inner surface 1112 of the first plate 111, the zone Z where the third capillary structure 140 is located is within a projection P of the heat source 10 projected onto the inner surface 1112, and an area of the zone Z is smaller than an area of the projection P of the heat source 10. In the embodiment, the third capillary structure 140 comprises metal powders or non-woven metal wool, and the third capillary structure 140 is only filled in a part of the trenches 114 corresponding to the zone Z.

It is noted that although the location of the heat source 10 (the projection P) and the zone Z are shown in the center of the first plate 111 in FIG. 6B, the location of the heat source 10 (the projection P) and the zone Z are not limited thereto. In some embodiments, the location of the heat source 10 (the projection P) and the zone Z may be located at positions near a corner or a side of the first plate 111.

In addition, a number of the heat source 10 and the zone Z are also not limited thereto. In an embodiment, if a number of the heat source 10 is greater than one, the third capillary structure 140 can be filled in the zones Z corresponding to the heat sources 10. The zones Z may be separated from each other. In an embodiment, even the number of the heat source 10 is one, if the heat source 10 is large and has hot spots, the third capillary structure 140 may be filled in the zones Z corresponding to the hot spots. The zones Z may be separated from each other.

Moreover, the arrangement and the extension direction of the first capillary structure 113 are not limited thereto. The first capillary structure 113 may be arranged along radial directions or multiple direction.

Because the third capillary structure 140 filled in the first capillary structure 113 may raise capillarity and flow resistance at the same time, capillarity may improve heat dissipation, while the flow resistance may reduce heat dissipation. Therefore, the balance between capillarity and flow resistance provided by the third capillary structure 140 is important. The ratio of the area of the zone Z where the third capillary structure 140 is located to the area of the projection P of the heat source 10 may influence the performance of capillarity and flow resistance, so as to influence heat dissipation efficiency.

Figure 6C:
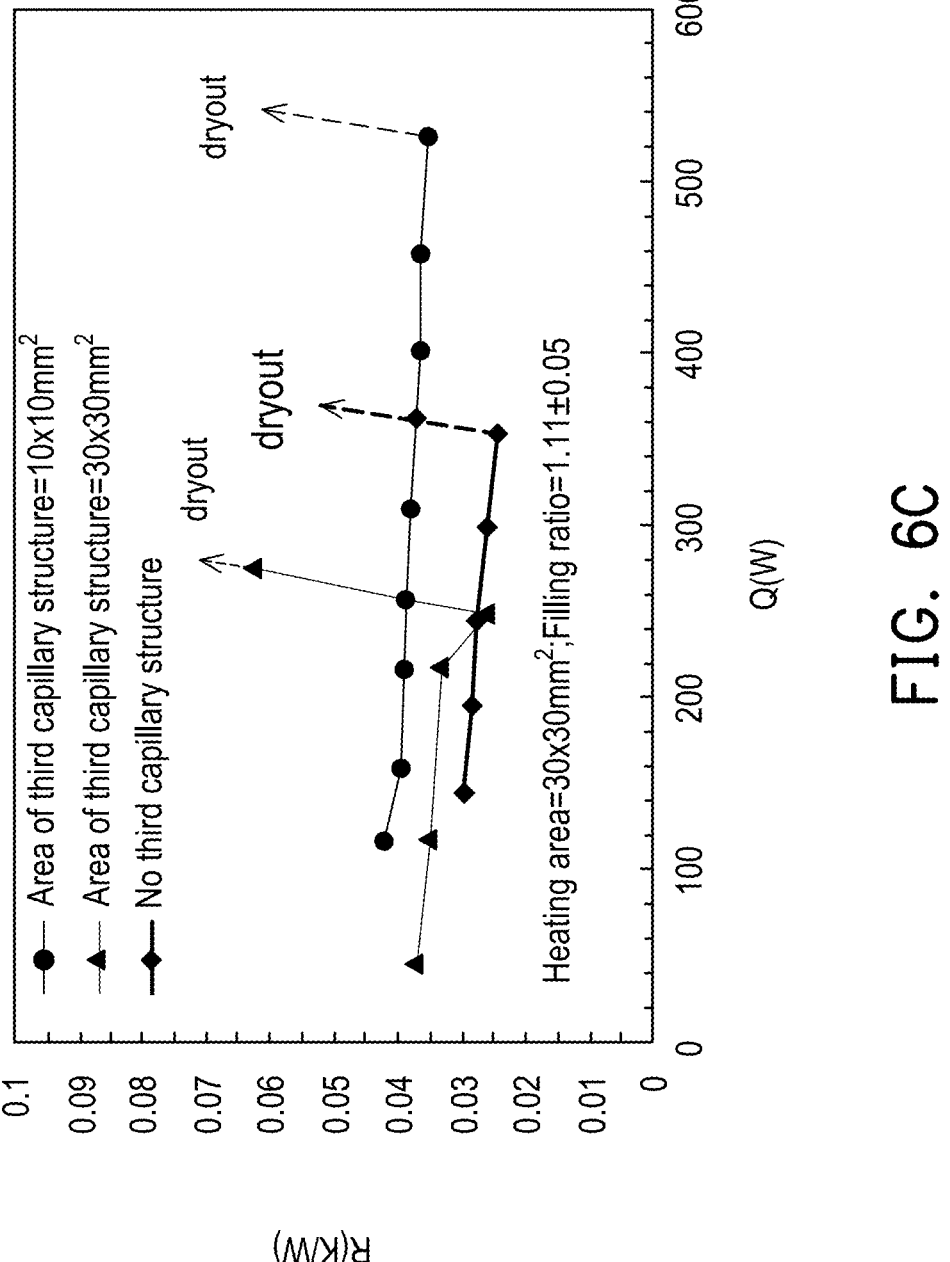
FIG. 6C is an experimental result view of R value (thermal resistance)-Q value (heat) of different vapor chamber systems.

FIG. 6C is an experimental result view of R value (thermal resistance)-Q value (heat) of different vapor chamber systems. Referring to FIG. 6C, FIG. 6C compares the values of $Q_{max}$ achieved with different areas of the third capillary structure 140 (for example, copper powders). There are three vapor chamber devices conduct the experiment. The first one of the vapor chamber devices has no third capillary structure 140, that is, the first one of the vapor chamber devices only has the first capillary structure 113 (for example, trenches 114) and the second capillary structure 130 (for example, a layer of copper mesh).

The second one of the vapor chamber devices has the third capillary structure 140, and the third capillary structure 140 is filled in a part of the first capillary structure 113 which totally corresponds to the projection P of the heat source 10. In the experiment, the area of the heat source 10 is 30×30 mm$^2$, and the area of the third capillary structure 140 in the second one of the vapor chamber devices is also 30×30 mm$^2$.

The third one of the vapor chamber devices is the vapor chamber device 100f of FIG. 6A, the area of the third capillary structure 140 in vapor chamber device 100f is smaller than the area of the heat source 10. In the experiment, the area of the heat source 10 is 30×30 mm$^2$, and the area of the third capillary structure 140 in the vapor chamber device 100f is 10×10 mm$^2$.

The filling ratios (volume of the filled water versus the pore volume of the first capillary structure 113) of all the three vapor chamber devices are within 1.11±0.05.

As shown in FIG. 6C, the $Q_{max}$ of the first one of the vapor chamber devices is 352 W, the $Q_{max}$ of the second one of the vapor chamber devices is only 246 W, even smaller than that of the first one of the vapor chamber devices (352 W), due to the large flow resistance associated with the third capillary structure 140 (copper powders).

However, as shown in the experimental result of the third one of the vapor chamber devices (the vapor chamber device 100f), when the area of the third capillary structure 140 is reduced to 10×10 mm$^2$, the $Q_{max}$ can be increased to 526 W, because the flow resistance is reduced for the smaller area of the third capillary structure 140 (copper powders). This means that the area of the third capillary structure 140 cannot be as large as the heating area (here, 30×30 mm$^2$), but should be reduced to a certain smaller area to reduce the flow resistance with maintained high capillary force.

In an embodiment, a ratio of the area of the zone Z to the area of the projection P of the heat source 10 is between 0.001~0.5. In some embodiments, the heat source 10 is, for example, a GPU chip used for AI, because the size of the heat source 10 is getting larger, if the area of the projection P is 60×60 mm$^2$, the area of the zone Z of the third capillary structure 140 is reduced to 5×5 mm$^2$, and the ratio of the area of the zone Z to the area of the projection P of the heat source 10 is 0.007. If the area of the projection P is 80×80 mm$^2$, the area of the zone Z of the third capillary structure 140 is reduced to 5×5 mm$^2$, and the ratio of the area of the zone Z to the area of the projection P of the heat source 10 is 0.004.

In an embodiment, a ratio of the area of the zone Z to the area of the projection P of the heat source 10 is between 0.05~0.2. Due to the design, the vapor chamber system 20 is capable of providing good heat dissipation performance.

Figure 6D:
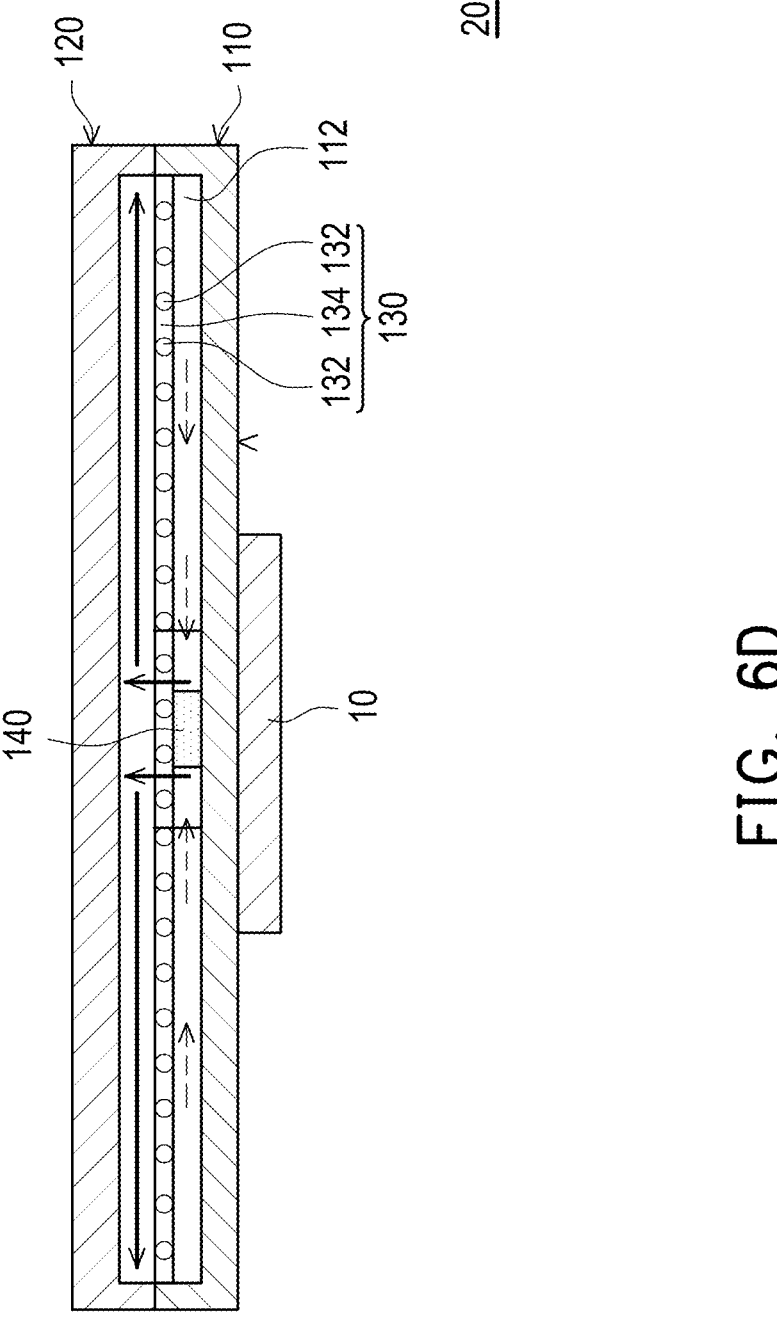
FIG. 6D is another schematic cross-sectional view of the vapor chamber system of FIG. 6A.

FIG. 6D is another schematic cross-sectional view of the vapor chamber system of FIG. 6A. As shown in FIG. 6D, in the embodiment, the third capillary structure 140 is only disposed between the inner surface 1112 of the first plate 111 and the second capillary structure 130, the third capillary structure 140 is not filled into the second capillary structure 130. Certainly, the arrangement of the third capillary structure 140 is not limited thereto.

Figure 7A:
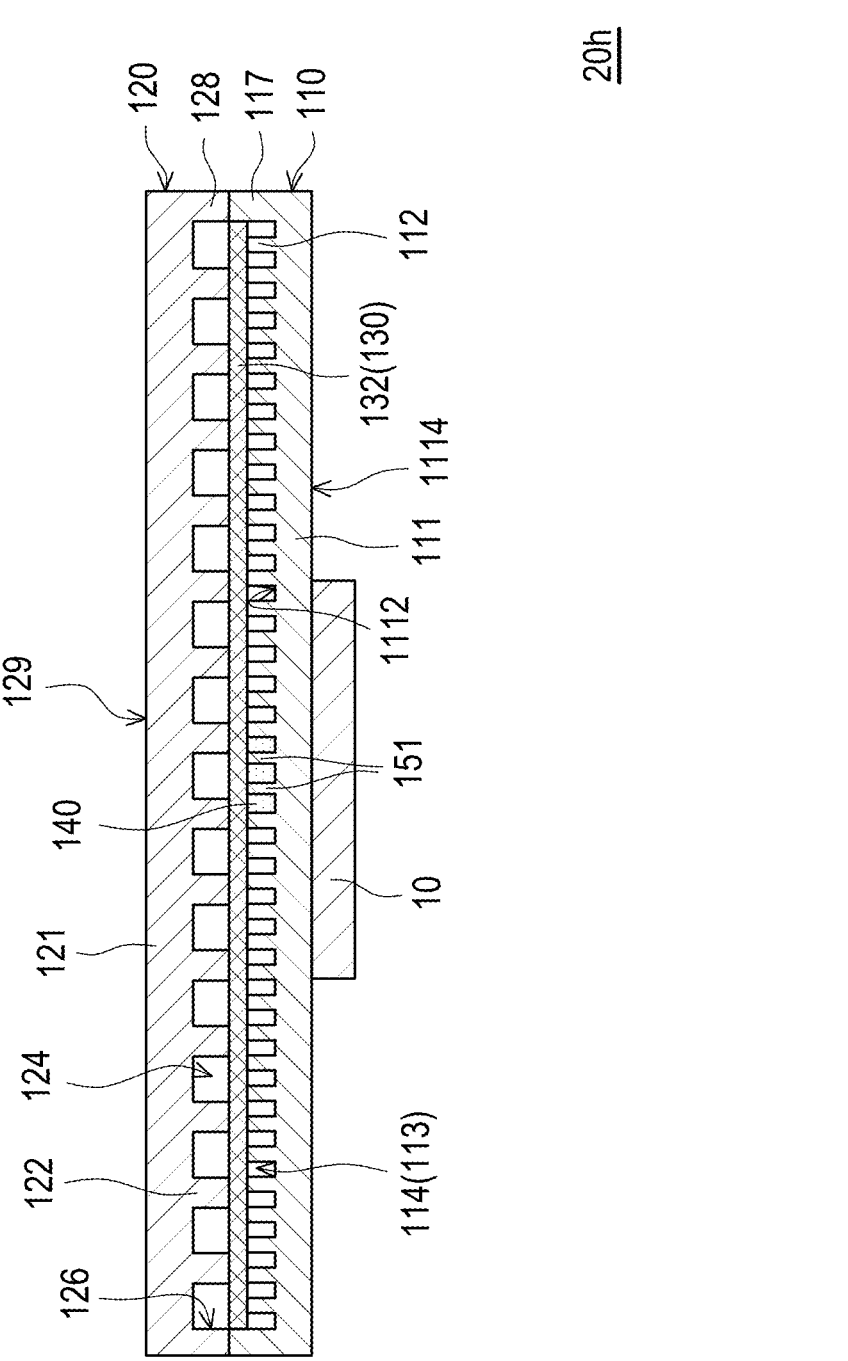
FIG. 7A is a schematic cross-sectional view of a vapor chamber system according to another embodiment of the disclosure.
Figure 7B:
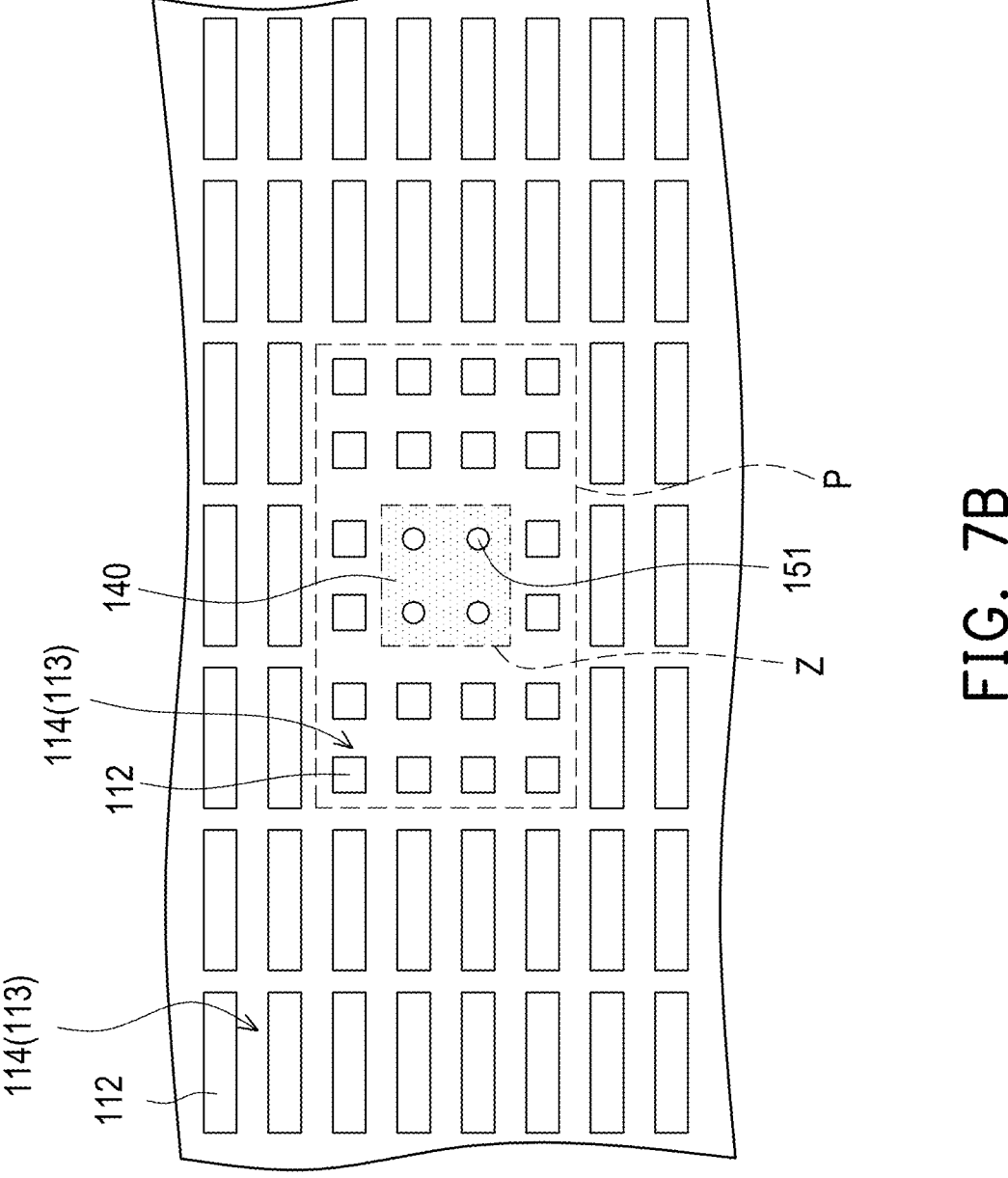
FIG. 7B is a partial schematic diagram of an inner surface of a first casing of the vapor chamber device of FIG. 7A.

FIG. 7A is a schematic cross-sectional view of a vapor chamber system according to another embodiment of the disclosure. FIG. 7B is a partial schematic diagram of an inner surface of a first casing of the vapor chamber device of FIG. 7A.

Referring to FIG. 7A and FIG. 7B, a difference between the vapor chamber system 20h of FIG. 7B and the vapor chamber system 20 of FIG. 6B is that, in FIG. 7B, the first capillary structure 113 is not distributed evenly. Specifically, the first capillary structure 113 is not disposed in the zone Z where the third capillary structure 140 is located. Certainly, in other embodiment, a part of the first capillary structure 113 may be disposed in the zone Z where the third capillary structure 140 is located, and the supporters 151 may contact the part of the first capillary structure 113 in the zone Z. The arrangement of the first capillary structure 113 is not limited thereto.

In addition, in order to support the second capillary structure 130, the first casing 110 includes a plurality of supporters 151 disposed in the zone Z where the third capillary structure 140 is located, and the third capillary structure 140 surrounds the supporters 151. In other words, the third capillary structure 140 is not filled in the trenches 114 of the first capillary structure 113.

Similarly, in the vapor chamber system 20h of FIG. 7A, the third capillary structure 140 corresponds to the zone Z within the projection P of the heat source 10 so as to obtain good heat dissipation performance.

Based on the above, for the vapor chamber system of the disclosure, the third capillary structure is disposed at the zone of the inner surface of the first plate, the zone is within the projection of the heat source projected onto the inner surface, and the area of the zone is smaller than the area of the projection of the heat source, so as to improve heat dissipation efficiency.

What is claimed is:

1. A vapor chamber system, comprising:
a heat source;
a vapor chamber device, comprising:
a first casing comprising a first plate, a first capillary structure at an inner surface of the first plate, and a first lateral wall protruding from the inner surface and surrounding the first capillary structure, wherein the heat source is in contact with an outer surface of the first plate;

a second casing stacked on the first casing and comprising a second plate, a plurality of supporting posts protruding from the second plate, and a second lateral wall protruding from the second plate and surrounding the supporting posts, wherein the supporting posts face towards the first capillary structure, and the first lateral wall is connected to the second lateral wall;
a second capillary structure disposed between the first capillary structure and the supporting posts of the second casing, wherein the supporting posts abut against the second capillary structure; and
a third capillary structure disposed at a zone of the inner surface of the first plate, wherein the third capillary structure comprises metal powders or non-woven metal wool, the zone is within a projection of the heat source projected onto the inner surface, and an area of the zone is smaller than an area of the projection of the heat source.

2. The vapor chamber system according to claim 1, wherein the first capillary structure comprises a plurality of trenches formed between a plurality of protruding bars, the third capillary structure is only filled in a part of the trenches corresponding to the zone.

3. The vapor chamber system according to claim 1, wherein the first capillary structure is not disposed in the zone, the first casing comprises a plurality of supporters disposed in the zone, and the third capillary structure surrounds the supporters.

4. The vapor chamber system according to claim 1, wherein the third capillary structure is only disposed between the inner surface of the first plate and the second capillary structure, the third capillary structure is not filled into the second capillary structure.

5. The vapor chamber system according to claim 1, wherein a part of the first capillary structure is disposed in the zone where the third capillary structure is located, the first casing comprises a plurality of supporters disposed in the zone, the third capillary structure surrounds the supporters, and the supporters contacts the part of the first capillary structure in the zone.

6. The vapor chamber system according to claim 1, wherein a ratio of the area of the zone to the area of the projection of the heat source is between 0.001~0.5.

7. The vapor chamber system according to claim 1, wherein a ratio of the area of the zone to the area of the projection of the heat source is between 0.05~0.2.

* * * * *